United States Patent
Li et al.

(10) Patent No.: US 11,139,778 B1
(45) Date of Patent: Oct. 5, 2021

(54) APPARATUS, CIRCUITS AND METHODS FOR CLOCK GENERATION

(71) Applicant: Taiwan Semiconductor Manufacturing Co., Ltd., Hsinchu (TW)

(72) Inventors: Chao-Chieh Li, Hsinchu (TW); Robert Bogdan Staszewski, Dublin (IE)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/836,405

(22) Filed: Mar. 31, 2020

(51) Int. Cl.
*H03B 5/12* (2006.01)

(52) U.S. Cl.
CPC ......... *H03B 5/1212* (2013.01); *H03B 5/1253* (2013.01); *H03B 5/1265* (2013.01)

(58) Field of Classification Search
CPC .................................................... H03B 5/1212
USPC ..................................................... 331/117 FE
See application file for complete search history.

(56) References Cited

U.S. PATENT DOCUMENTS

| | | | |
|---|---|---|---|
| 9,356,557 B1* | 5/2016 | Gao | H03B 5/1268 |
| 2010/0207695 A1* | 8/2010 | Bao | H03B 5/1228 |
| | | | 331/117 FE |
| 2010/0238843 A1* | 9/2010 | Taghivand | H03B 5/1296 |
| | | | 370/277 |
| 2014/0203881 A1* | 7/2014 | Lu | H03B 5/1212 |
| | | | 331/117 FE |
| 2014/0320215 A1* | 10/2014 | Staszewski | H03B 5/124 |
| | | | 331/18 |
| 2014/0368285 A1* | 12/2014 | Lu | H03B 5/1243 |
| | | | 331/117 FE |
| 2015/0357977 A1* | 12/2015 | Bonaccio | H03B 5/10 |
| | | | 331/117 FE |
| 2016/0056762 A1* | 2/2016 | Ximenes | H03M 1/002 |
| | | | 331/117 FE |
| 2016/0099681 A1* | 4/2016 | Zong | H03B 5/1296 |
| | | | 331/117 FE |
| 2017/0126177 A1* | 5/2017 | Kalia | H03B 5/1228 |
| 2018/0109225 A1* | 4/2018 | Jin | H03B 5/1228 |

\* cited by examiner

*Primary Examiner* — Joseph Chang
(74) *Attorney, Agent, or Firm* — Duane Morris LLP (57) ABSTRACT

Apparatus, circuits and methods for clock generation are disclosed herein. In some embodiments, an apparatus is disclosed. The apparatus includes: a first transistor pair electrically coupled to a pair of output nodes; a second transistor pair electrically coupled to the pair of output nodes; and an inductive unit electrically coupled between the output nodes and electrically coupled between gates of the first transistor pair. The inductive unit comprises: a first inductive element electrically coupled to one gate of the first transistor pair; and a second inductive element electrically coupled to one of the output nodes. The first inductive element and the second inductive element are configured to be magnetically coupled to each other.

20 Claims, 7 Drawing Sheets

APPARATUS, CIRCUITS AND METHODS FOR CLOCK GENERATION

BACKGROUND

Clock signals are commonly used in electronic devices for a variety of purposes, including circuit operation, synchronization, and the like. Clock signals are created by a clock generator circuit, which typically includes an oscillator.

A voltage controlled oscillator (VCO) is an electronic oscillator whose oscillation frequency is controlled by an input voltage. A VCO can be applied as a precision waveform generator in phase-locked loops (PLLs) and frequency synthesizers. A conventional VCO may have a cross-coupled differential topology. An oscillator in this topology tends to have a worst power supply rejection ratio (PSRR) due to a connection between gate and drain of transistors in the oscillator. Moreover, the direct current (DC) operating point in the gate bias of the transistors is easily affected by mismatches in the silicon.

While conventional transformer based oscillators have low phase noise and low frequency pushing, they suffer from the reliability issue because the voltages swing around the DC level of the supply power. The peak voltage of oscillated swing could easily break up the limits of the drain side and the gate side in the oscillator. As such, the existing oscillators are not entirely satisfactory to overcome the above mentioned drawbacks.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAIL DESCRIPTION

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

The present disclosure provides circuits and methods for generating clock signals with good phase noise and high reliability. In one embodiment, a disclosed oscillator has a complementary topology and a transformer. The disclosed oscillator may have two pairs of transistors in complementary topology to help maintaining a symmetric waveform and a low flicker noise corner. In one embodiment, the two pairs of transistors may include a pair of p-type metal-oxide-semiconductor (PMOS) transistors and a pair of n-type metal-oxide-semiconductor (NMOS) transistors. The oscillation swing can lie at a DC level of about ½ supply voltage (VDD), based on a design of the width to length (W/L) ratios of the PMOS and NMOS transistors. The peak swing of the output voltages is lower than the VDD to achieve an immunity to the reliability issue.

In addition, the disclosed oscillator has adopted a transformer between the drain side to the gate side of the transistors. In one embodiment, the transformer has a 1:2 inductance ratio from the drain side to the gate side. This helps to provide a large voltage gain and third harmonic tone at the drain side. As such, the voltage waveforms at the drain side, i.e. at the outputs of the complementary transformer based oscillator, have a good approximation to the square-wave shapes, which provides a good phase noise performance and power efficiency. Since the gate bias and the drain bias can be separated, the frequency pushing is also much better than a conventional design.

The disclosed oscillator may be applied to any clock generation circuit, e.g. as a LC tank based voltage controlled oscillator (VCO) or digitally controlled oscillator (DCO) in a digital circuit design with a phase-locked loop.

Figure 1:
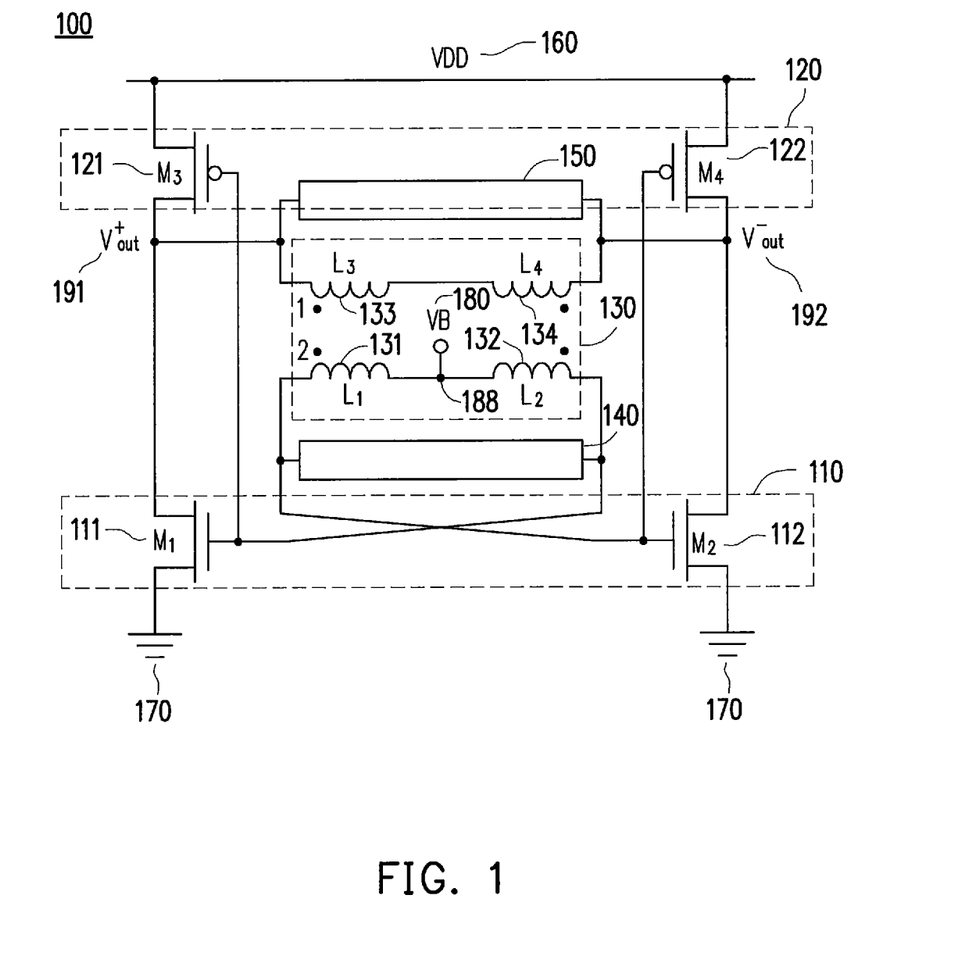
FIG. 1 illustrates a circuit diagram of an exemplary oscillator, in accordance with some embodiments of the present disclosure.

FIG. 1 illustrates a circuit diagram of an exemplary oscillator 100, in accordance with some embodiments of the present disclosure. As shown in FIG. 1, the exemplary oscillator 100 operates in a power domain defined by a supply voltage VDD 160 and a reference voltage GND 170. The exemplary oscillator 100 includes a first transistor pair 110 and a second transistor pair 120. The first transistor pair 110 includes a first transistor M1 111 and a second transistor M2 112. The second transistor pair 120 includes a third transistor M3 121 and a fourth transistor M4 122.

In one embodiment, each of the first transistor M1 111, the second transistor M2 112, the third transistor M3 121 and the fourth transistor M4 122 includes a metal-oxide semiconductor (MOS) transistor. In one embodiment, each of the first transistor M1 111 and the second transistor M2 112 includes an n-type metal-oxide semiconductor (NMOS) transistor; and each of the third transistor M3 121 and the fourth transistor M4 122 includes a p-type metal-oxide semiconductor (PMOS) transistor. In other embodiments, each of the first transistor M1 111, the second transistor M2 112, the third transistor M3 121 and the fourth transistor M4 122 includes a metal-oxide-semiconductor field-effect transistor (MOSFET).

The oscillator 100 generates an oscillator output signal $V^+_{out}$ 191 at an output node coupled to a drain of the first transistor M1 111 and a drain of the third transistor M3 121; and generates an oscillator output signal $V^-_{out}$ 192 at an output node coupled to a drain of the second transistor M2 112 and a drain of the fourth transistor M4 122. The oscillator signal $V^+_{out}$ 191 is opposite to the oscillator signal $V^-_{out}$ 192 in voltage polarity.

The pair of output nodes $V^+_{out}$ 191 and $V^-_{out}$ 192 are electrically coupled between the first transistor pair 110 and the second transistor pair 120. The oscillator 100 further includes an inductive unit 130 electrically coupled between the output nodes $V^+_{out}$ 191 and $V^-_{out}$ 192. As shown in FIG. 1, the inductive unit 130 includes a first inductive element 131 electrically coupled to a gate of the second transistor M2 112 and a gate of the fourth transistor M4 122; and includes a second inductive element 133 electrically coupled to the output node $V^+_{out}$ 191. The first inductive element 131 and the second inductive element 133 are configured to be magnetically coupled to each other and to generate a variable inductance. Similarly, the inductive unit 130 further includes a third inductive element 132 electrically coupled to a gate of the first transistor M1 111 and a gate of the third transistor M3 121; and includes a fourth inductive element 134 electrically coupled to the output node $V^-_{out}$ 192. The third inductive element 132 and the fourth inductive element 134 are configured to be magnetically coupled to each other and to generate a variable inductance. The first inductive element has an inductance value larger than or equal to that of the second inductive element; and the third inductive element has an inductance value larger than or equal to that of the fourth inductive element.

In one embodiment, the inductive unit 130 is a transformer including inductors L1, L2, L3, L4. That is, each of the inductive elements in the inductive unit 130 is an inductor. The first transistor M1 111 and the second transistor M2 112 form an inductively cross-coupled pair, as the gate of the first transistor M1 111 is connected to the drain of the second transistor M2 112 via the transformer 130 and the gate of the second transistor M2 112 is connected to the drain of the first transistor M1 111 via the transformer 130. Similarly, the third transistor M3 121 and the fourth transistor M4 122 form an inductively cross-coupled pair, as the gate of the third transistor M3 121 is connected to the drain of the fourth transistor M4 122 via the transformer 130 and the gate of the fourth transistor M4 122 is connected to the drain of the third transistor M3 121 via the transformer 130. As discussed above, each pair of transistors could be NMOS transistors or PMOS transistors to provide negative resistance for oscillation.

In one embodiment of the inductive unit 130, the first inductor L1 in polarity is opposite to the fourth inductor L4. The first inductor L1, coupled between a bias voltage VB 180 and the gate of the second transistor M2 112, functions to, in a small signal mode, provide a voltage swing at the gate of the second transistor M2 112. Similarly, because the first inductor L1 is also coupled between the bias voltage VB 180 and the gate of the fourth transistor M4 122, the first inductor L1 functions to, in a small signal mode, provide a voltage swing at the gate of the fourth transistor M4 122 as well. The fourth inductor L4, magnetically coupled to the first inductor L1 and electrically coupled to the output node $V^-_{out}$ 192, can provide a voltage swing at the output node $V^-_{out}$ 192, i.e. at the drain of the second transistor M2 112 and the drain of the fourth transistor M4 122. An inductance ratio of the first inductor L1 to the fourth inductor L4 may be N:1, wherein N is an integer larger than 1. In one embodiment, the first inductor L1 and the fourth inductor L4 share a same core or have a core with a same geometry. In that case, the inductance ratio between the two inductors is equal to a turn ratio between the two inductors. For example, as shown in FIG. 1, a turn ratio of the first inductor L1 to the fourth inductor L4 is 2:1.

As shown in FIG. 1, the oscillator 100 is symmetric in circuit structure. As such, the inductive unit 130 further includes the second inductor L2 and the third inductor L3, where the second inductor L2 in polarity is opposite to the third inductor L3. Due to symmetric circuit structure, an operation among the first inductor L1, the fourth inductor L4, the second transistor M2 112 and the fourth transistor M4 122 is substantially the same as another operation among the second inductor L2, the third inductor L3, the first transistor M1 111 and the third transistor M3 121.

In another embodiment of the inductive unit 130, the first inductor L1 in polarity is opposite to the third inductor L3; while the second inductor L2 in polarity is opposite to the fourth inductor L4. In either embodiment of the inductive unit 130, the swing voltages at the output nodes $V^+_{out}$ 191 and $V^-_{out}$ 192 are controlled below the supply voltage VDD 160, to avoid the reliability issue. A process dependent reliability threshold Vmax is usually configured to be higher than the supply voltage VDD 160. When the oscillator 100 operates at a voltage higher than the reliability threshold Vmax, the circuit lifetime of the oscillator 100 will be impacted and/or reduced, which causes the oscillator 100 to unreliable. Since the swing voltages at the output nodes $V^+_{out}$ 191 and $V^-_{out}$ 192 are controlled below the supply voltage VDD 160, they are below the reliability threshold Vmax as well. As such, no reliability issue is induced in the oscillator 100. In either embodiment of the inductive unit 130, the transformer 130 has an inductance ratio M:N from the drain side (at the output nodes $V^+_{out}$ 191 and $V^-_{out}$ 192) to the gate side of the transistors in the oscillator 100, wherein both M and N are integers, and M is smaller than or equal to N.

As shown in FIG. 1, a 1:2 transformer 130 is adopted from the drain side to the gate side to provide a passive voltage gain. Accordingly, the third harmonic signal could be obtained at drain side, which helps to make the waveform sharper at the edges and shows an immunity to flicker noise. In addition, the drain bias and the gate bias are separated in the oscillator 100 to lower the supply pushing, since the gate's capacitance variation to bias is larger than, e.g. several times more than, the drain's.

Furthermore, as shown in FIG. 1, the oscillator 100 also includes a first capacitance unit 140 and a second capacitance unit 150 for frequency tuning. The first capacitance unit 140 is electrically coupled between the gates of the first transistor M1 111 and the second transistor M2 112 and is electrically connected in parallel with the inductive unit 130. The second capacitance unit 150 is electrically coupled between the output nodes $V^+_{out}$ 191 and $V^-_{out}$ 192 and is electrically connected in parallel with the inductive unit 130. Each of the first capacitance unit 140 and the second capacitance unit 150 comprises at least one of: a capacitor, a switched capacitor whose resistance is dependent on a switching frequency of the switched capacitor, and a varactor whose capacitance is dependent on a bias voltage applied across the varactor.

As shown in FIG. 1, each of the first transistor M1 111 and the second transistor M2 112 has a source electrically connected to a ground pin GND 170. As shown in FIG. 1, each of the third transistor M3 121 and the fourth transistor M4 122 has a source electrically connected to a power supply pin VDD 160. Since the oscillator 100 has the complementary and inductively cross-coupled differential topology and is a transformer based oscillator, it can achieve a good phase noise, low frequency pushing, symmetric waveform and immunity of reliability issue.

According to various embodiments, the transformer 130 can be formed in various manners. In one embodiment, the transformer 130 includes two inductors that are formed on a same metal layer and are horizontally and magnetically coupled to each other. In one embodiment, each of the two inductors has at least one turn and an even number of ports. In one example, the first inductor has: a first turn located inside the at least one turn of the second inductor; a second turn located outside the at least one turn of the second inductor; or both. In another example, the first inductor has: a first port located inside the at least one turn of the second inductor; a second port located outside the at least one turn of the second inductor; or both. In one embodiment, each of the two inductors is a differentially excited inductor having a symmetric layout. In one embodiment, each of the two inductors is formed based on two single-ended spiral inductors.

Figure 2:
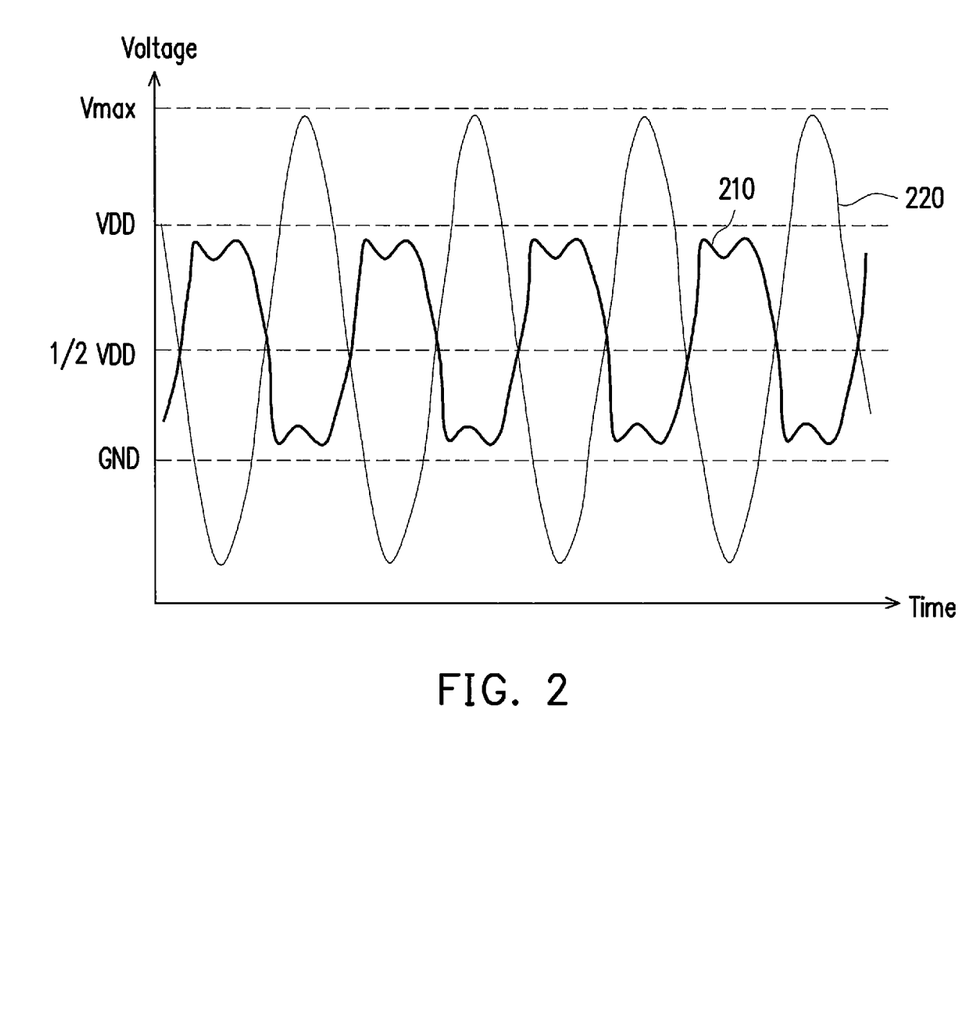
FIG. 2 illustrates voltage waveforms for the exemplary oscillator shown in FIG. 1, in accordance with some embodiments of the present disclosure.

FIG. 2 illustrates voltage waveforms for the exemplary oscillator shown in FIG. 1, in accordance with some embodiments of the present disclosure. As shown in FIG. 2, the waveform 210 represents the voltage at a drain of a transistor, e.g. the first transistor M1 111, in the oscillator 100; while the waveform 220 represents the voltage at a gate of a transistor, e.g. the first transistor M1 111, in the oscillator 100. Since the inductance ratio of the transformer 130 is 1:2 from the drain side to the gate side of the transistors in the oscillator 100, a peal-to-peak value of the gate voltage 220 is about twice as large as a peal-to-peak value of the drain voltage 210.

As shown in FIG. 2, both the drain voltage waveform 210 and the gate voltage waveform 220 swing around a DC level of about ½ supply voltage VDD, which can be configured by setting a width to length (W/L) ratio of the PMOS and NMOS transistors. As such, the drain voltage waveform 210 swings between the supply voltage VDD and the reference voltage GND, which ensures no reliability issue for the drain voltage. While the gate voltage waveform 220 swings beyond the supply voltage VDD and the reference voltage GND, it swings below the reliability threshold Vmax, which ensures no reliability issue for the gate voltage.

The illustrated embodiment of the waveforms 210, 220 is merely an example of waveforms at some components of the oscillator 100. Therefore, waveforms from other components or from repeated measurement can be added while remaining within the scope of the present disclosure.

Figure 3:
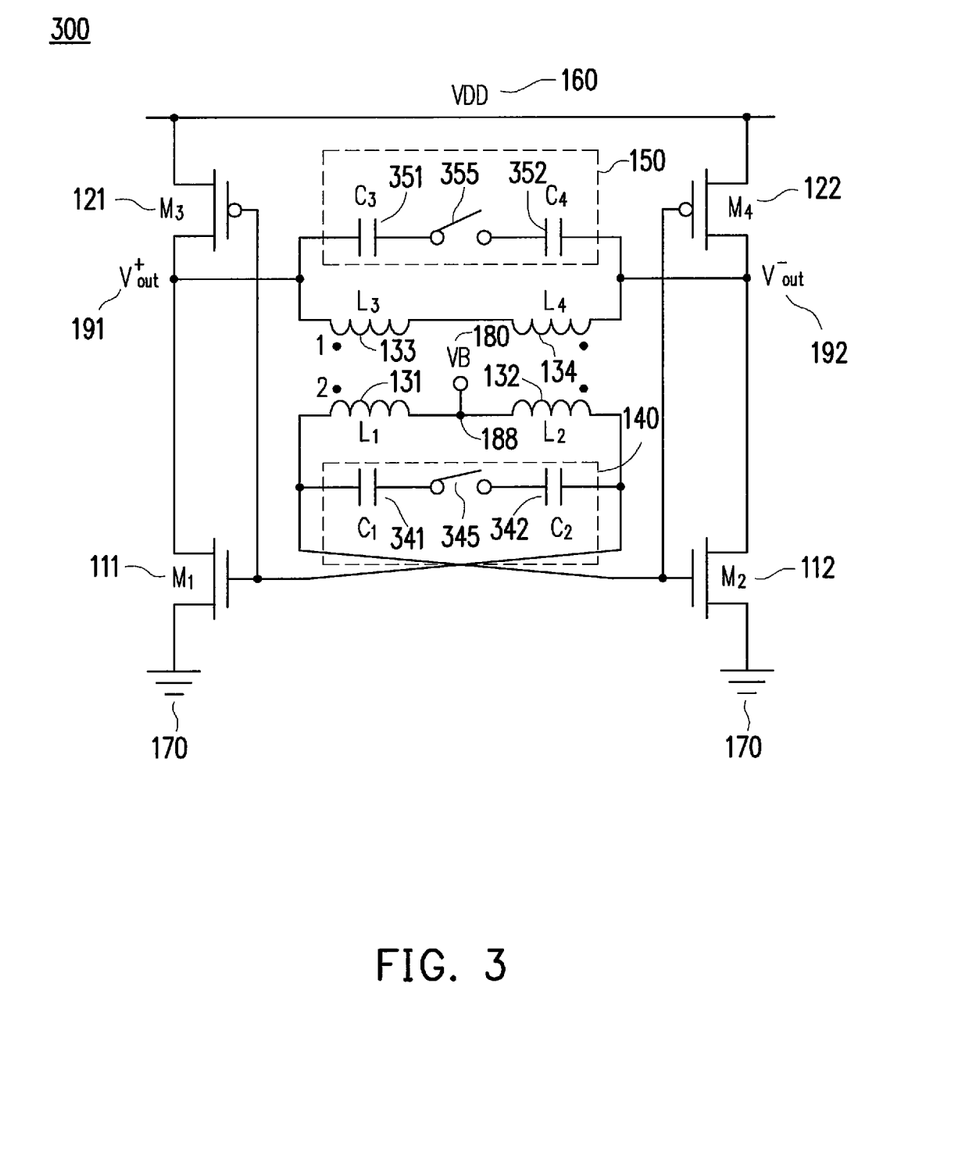
FIG. 3 illustrates an exemplary complementary transformer-based oscillator consistent with the circuit diagram in FIG. 1, in accordance with one embodiment of the present disclosure.

FIG. 3 illustrates an exemplary complementary transformer-based oscillator 300 consistent with the circuit diagram in FIG. 1, in accordance with one embodiment of the present disclosure. As shown in FIG. 3, the complementary transformer-based oscillator 300 is similar to the oscillator 100 described and illustrated with reference to FIG. 1 except that, for example, the oscillator 300 includes a detailed circuit diagram of the first capacitance unit 140 and the second capacitance unit 150. As shown in FIG. 3, the first capacitance unit 140 in the oscillator 300 includes capacitors C1 341 and C2 342 that are connected by a switch 345; and the second capacitance unit 150 in the oscillator 300 includes capacitors C3 351 and C4 352 that are connected by a switch 355.

According to various embodiments, each of the capacitors C1 to C4 in the LC tank oscillator 300 could be adopted by a metal-oxide-metal (MOM) capacitor, a metal-insulator-metal (MIM) capacitor, a varactor, a metal-oxide-semiconductor (MOS) capacitor or any other device which provides capacitance. According to various embodiments, each of the inductors L1 to L4 could be implemented by a single ended spiral inductor, a differential spiral inductor or any other device that provides inductance.

As shown in FIG. 3, the drain of the first transistor M1 111 is directly connected with the drain of the third transistor M3 121; and the drain of the second transistor M2 112 is directly connected with the drain of the fourth transistor M4 122. The gates of the first transistor M1 111 and the third transistor M3 121 are connected together and short connected to the inductor L2 132 and the capacitor C2 342; and gates of the second transistor M2 112 and the fourth transistor M4 122 are connected together and short connected to the inductor L1 131 and the capacitor C1 341. The drains of the first transistor M1 111 and the third transistor M3 121 are connected together and short connected to the inductor L3 133 and the capacitor C3 351; and the drains of the second transistor M2 112 and the fourth transistor M4 122 are connected together and short connected to the inductor L4 134 and the capacitor C4 352.

The transistors M1 to M4 function like two inductively cross-coupled pairs to provide sufficient negative resistance for oscillation start up. The sizes, including widths, lengths, etc., of the transistors M1 and M2 are the same for symmetric differential operation. The sizes, including widths, lengths, etc., of the transistors M3 and M4 are the same for symmetric differential operation. The size ratio between the transistors M1, M2 and the transistors M3, M4 could be designed to provide a DC voltage of about ½ VDD at the drain side of the transistors M1 to M4, i.e. at the output nodes $V^+_{out}$ 191 and $V^-_{out}$ 192.

The switch 345 is put between the capacitor C1 341 and the capacitor C2 342 to provide different capacitances when the switch 345 is on and off. Similarly, the switch 355 is put between the capacitor C3 351 and the capacitor C4 352 to provide different capacitances when the switch 355 is on and off. The switch design for the switch 345 and the switch 355 could be based on complementary CMOS switches, NMOS or PMOS only devices, or any device which could turn on and off the connection between the two capacitors.

In one embodiment, the switch designs for the switch 345 and the switch 355 are differential to generate the symmetric waveforms. According to various embodiments, the capacitance value of the capacitor C1 341 is the same as or different from the capacitor C3 351; and the capacitance value of the capacitor C2 342 is the same as or different from the capacitor C4 352. In one embodiment, all of the capacitances of the capacitors C1 to C4 are the same.

In one embodiment, the inductors L3 and L4 are primary inductors forming a primary coil of a transformer; the inductors L1 and L2 are secondary inductors forming a secondary coil of the transformer. The secondary coil is magnetically coupled to the primary coil. For example, the secondary inductor L1 is magnetically coupled to the primary inductor L3; and the secondary inductor L2 is magnetically coupled to the primary inductor L4. In addition, the secondary inductor L1 has a larger inductance than the primary inductor L3; and the secondary inductor L2 has a larger inductance than the primary inductor L4. For example, the inductance ratio between the secondary inductor L1 and the primary inductor L3 is 2; and the inductance ratio between the secondary inductor L2 and the primary inductor L4 is 2. The 1:2 transformer ratio results in a higher voltage swing at the gate side than the voltage swing at the drain side.

Each of the primary coil and the secondary coil has a center tap. As shown in FIG. 3, the primary coil including the secondary inductors L1 and L2 has a center tap 188 electrically connected to a bias voltage VB 180.

In addition, the coupling coefficient of this transformer may be designed to a value, e.g. about 0.7, for injecting a third harmonic into the drain side and making the voltage waveform sharper at the edges. A sharp waveform provides immunity to flicker noise, which results in a lower phase noise.

Figure 4:
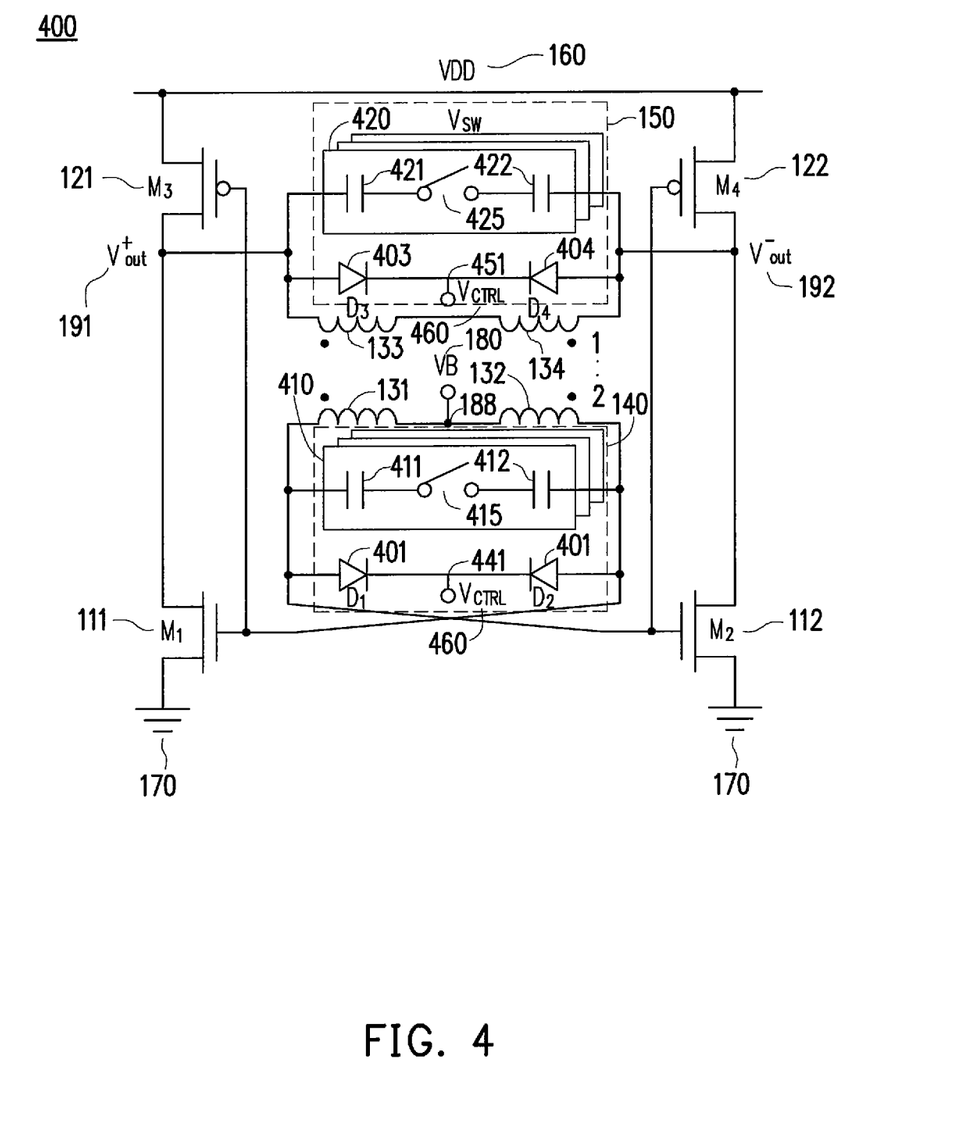
FIG. 4 illustrates another exemplary complementary transformer-based oscillator consistent with the circuit diagram in FIG. 1, in accordance with one embodiment of the present disclosure.

FIG. 4 illustrates another exemplary complementary transformer-based oscillator 400 consistent with the circuit diagram in FIG. 1, in accordance with one embodiment of the present disclosure. As shown in FIG. 4, the complementary transformer-based oscillator 400 is similar to the oscillator 100 described and illustrated with reference to FIG. 1 except that, for example, the oscillator 400 includes a detailed circuit diagram of the first capacitance unit 140 and the second capacitance unit 150. As shown in FIG. 4, the first capacitance unit 140 in the oscillator 400 includes a switched capacitor 410, a varactor D1 401 and a varactor D2 402; and the second capacitance unit 150 in the oscillator 400 includes a switched capacitor 420, a varactor D3 403 and a varactor D4 404.

The switched capacitor 410 in this example includes a plurality of parallel-connected branches, where each branch includes two capacitors 411, 412 that are serial-connected via a switch 415. Similarly, the switched capacitor 420 in this example includes a plurality of parallel-connected branches, where each branch includes two capacitors 421, 422 that are serial-connected via a switch 425. In one embodiment, the number of parallel-connected branches in the switched capacitor 410 is the same as the number of parallel-connected branches in the switched capacitor 420. In one embodiment, the total resistance and/or capacitance of the switched capacitor 410 is the same as the total resistance and/or capacitance of the switched capacitor 420.

The varactor D1 401 and the varactor D2 402 are serial-connected by their cathodes to form a varactor branch. The varactor branch is parallel-connected to the switched capacitor 410 to prevent from degrading resonant impedance. The varactor branch has a center tap 441 coupled to a controlled voltage $V_{CTRL}$ 460. Similarly, the varactor D3 403 and the varactor D4 404 are serial-connected by their cathodes to form a branch that is parallel-connected to the switched capacitor 420. The varactor branch is parallel-connected to the switched capacitor 420 to prevent from degrading resonant impedance, and has a center tap 451 coupled to the controlled voltage $V_{CTRL}$ 460. Each of the varactors D1 to D4 provides a voltage-dependent capacitance for frequency tuning. In one embodiment, each of the varactors D1 to D4 may be composed based on a NMOS or PMOS capacitor, a MOS varactor, or a NMOS or PMOS transistor with source, drain and body connected together. In one embodiment, the controlled voltage $V_{CTRL}$ 460 may be connected to a loop filter of a phase lock loop. In one embodiment, a metal shielding is performed on the circuit to prevent from noise coupling. Although FIG. 4 shows three parallel-connected switched capacitors and two serial-connected varactors in each capacitance unit 140, 150, according to various embodiments, any number of parallel-connected switched capacitors and any number of serial-connected varactors are within the scope of this disclosure. According to customer requirement, a capacitance unit may include merely switched capacitors or merely varactors.

Figure 5:
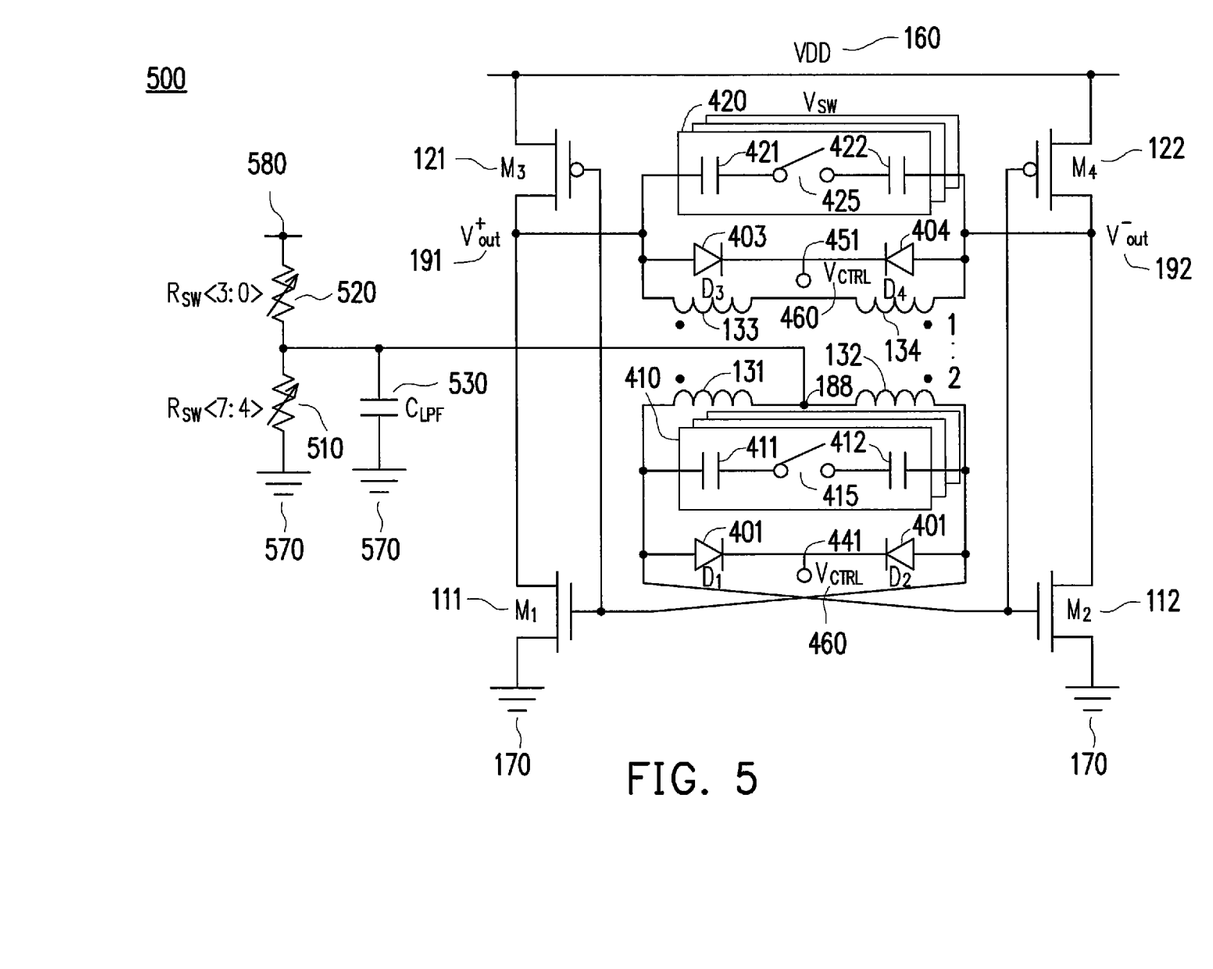
FIG. 5 illustrates an exemplary complementary transformer-based oscillator having a controlled voltage bias, in accordance with one embodiment of the present disclosure.

FIG. 5 illustrates an exemplary complementary transformer-based oscillator 500 having a controlled voltage bias, in accordance with one embodiment of the present disclosure. As shown in FIG. 5, the complementary transformer-based oscillator 500 is similar to the oscillator 400 described and illustrated with reference to FIG. 4 except that, for example, the oscillator 500 includes a detailed circuit diagram for providing a bias voltage to the center tap 188 of the secondary inductors 131, 132. As shown in FIG. 5, the center tap 188 is electrically connected to a variable resistor Rsw including two sections 510, 520. The variable resistor Rsw is coupled between a power supply node 580 and a ground node 570, to provide a fine tuning for the gate bias of the transistors M1 to M4. For example, by controlling the resistance ratio between the two sections 510, 520, or by controlling the connecting point of the center tap 188 at the variable resistor Rsw, a desired bias voltage can be applied to the center tap 188, and thereby to the gates of the transistors M1 to M4 via the inductors 131, 132.

As shown in FIG. 5, the center tap 188 is also electrically connected to a low pass capacitor $C_{LPF}$ 530 that is coupled between the center tap 188 and the ground node 570. A low pass capacitor is a capacitor coupled as a bypass for low pass filtering, and serves as a low pass filter for filtering out high frequency signals. The low pass capacitor $C_{LPF}$ 530 is put in the gate bias path to provide a low pass filtering for preventing a high frequency deterministic noise from injecting into the gate side, while directing merely low frequency signals to the gate side, e.g. the center tap 188.

Figure 6:
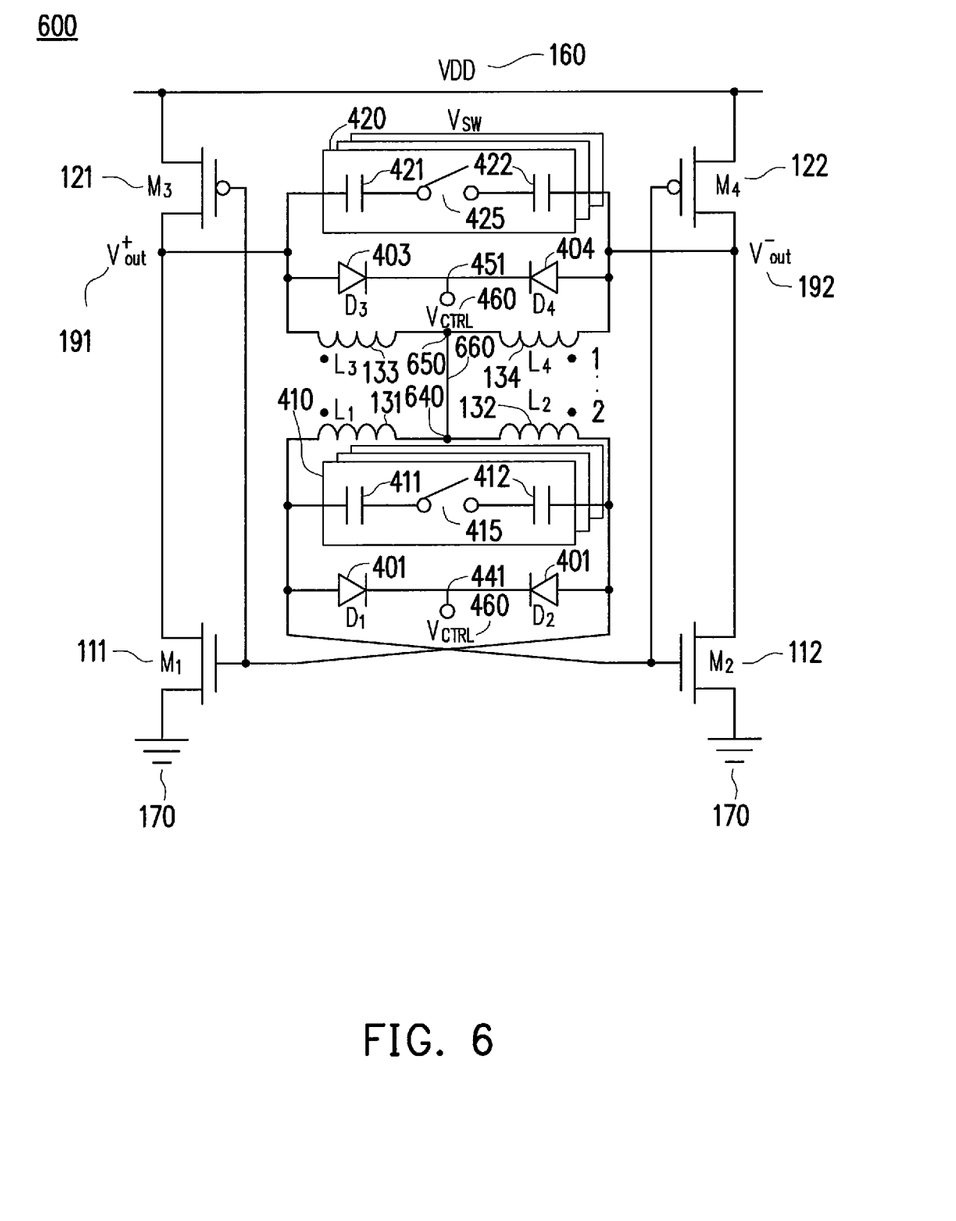
FIG. 6 illustrates another exemplary complementary transformer-based oscillator having a controlled voltage bias, in accordance with one embodiment of the present disclosure.

FIG. 6 illustrates another exemplary complementary transformer-based oscillator 600 having a controlled voltage bias, in accordance with one embodiment of the present disclosure. As shown in FIG. 6, the complementary transformer-based oscillator 600 is similar to the oscillator 400 described and illustrated with reference to FIG. 4 except that, for example, the oscillator 600 includes a detailed circuit diagram for providing a bias voltage to the gates of the transistors M1 to M4. As shown in FIG. 6, there is a short connection line 660 between the center tap 640 of inductors L1 131, L2 132 and the center tap 650 of inductors L3 133, L4 134. In this manner, the DC bias voltages at the drain side and at the gate side of the transistors M1 to M4 are the same. As such, the gate bias in oscillator 600 is self-biased based on the complementary and inductively cross-coupled topology. While the voltage controlled oscillator 500 designed in FIG. 5 can provide a smaller frequency pushing, the voltage controlled oscillator 600 designed in FIG. 6 can provide a smaller occupied area of the circuit.

Figure 7:
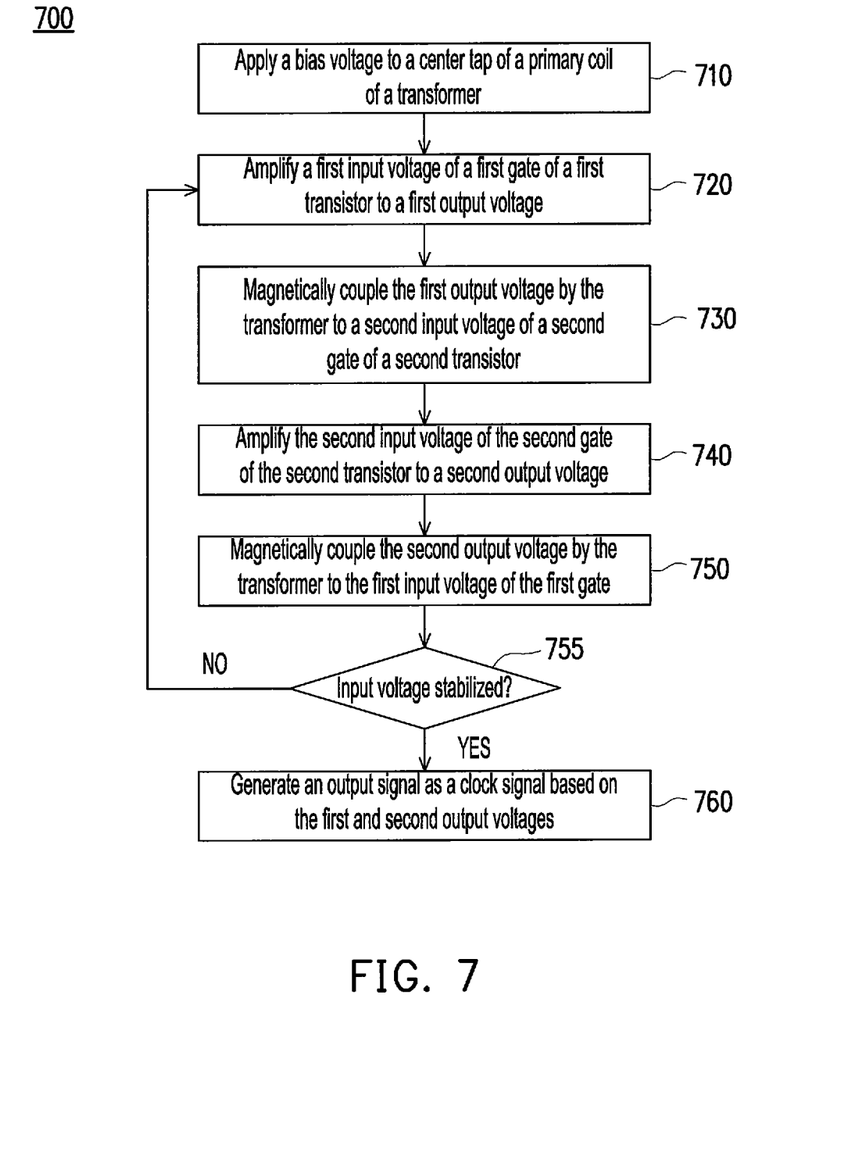
FIG. 7 illustrates a flow chart of a method for operating a complementary transformer-based oscillator, in accordance with one embodiment of the present disclosure.

FIG. 7 illustrates a flow chart of a method 700 for operating a circuit, e.g. a complementary transformer-based oscillator as shown in FIG. 1 or FIGS. 3-6, in accordance with one embodiment of the present disclosure. At operation 710, a bias voltage is applied to a center tap of a primary coil of a transformer of the circuit. At operation 720, a first input voltage of a first gate of a first transistor of the circuit is amplified to a first output voltage. At operation 730, the first output voltage is magnetically coupled by a transformer of the circuit to a second input voltage of a second gate of a second transistor of the circuit. At operation 740, the second input voltage of the second gate of the second transistor is amplified to a second output voltage. At operation 750, the second output voltage is magnetically coupled by the transformer to the first input voltage of the first gate. At operation 755, it is determined whether the first input voltage is stabilized. If so, the process proceeds to operation 760, where an output signal of the circuit is generated as a clock signal based on the first and second output voltages. If not, the process goes back to operation 720 to have another iteration of operations 720-750. In one embodiment, the first input voltage is stabilized when an absolute change of the first input voltage after one iteration, i.e. an operation repetition of the operations 720-750, is smaller than a predetermined threshold. The order of the operations in FIG. 7 may be changed according to various embodiments of the present teaching.

In some embodiments, an apparatus is disclosed. The apparatus includes: a first transistor pair electrically coupled to a pair of output nodes; a second transistor pair electrically coupled to the pair of output nodes; and an inductive unit electrically coupled between the output nodes and electrically coupled between gates of the first transistor pair. The inductive unit comprises: a first inductive element electrically coupled to one gate of the first transistor pair; and a second inductive element electrically coupled to one of the output nodes. The first inductive element and the second inductive element are configured to be magnetically coupled to each other.

In some embodiments, an oscillator is disclosed. The oscillator includes: a plurality of primary inductors; a plurality of secondary inductors each of which is magnetically coupled to a corresponding one of the plurality of primary inductors; a first pair of transistors comprising a first transistor and a second transistor; and a second pair of transistors comprising a third transistor and a fourth transistor. Each of the first, second, third and fourth transistors has a drain electrically connected to the plurality of primary inductors and has a gate electrically connected to the plurality of secondary inductors.

In some embodiments, an oscillator is disclosed. The oscillator includes: a first pair of transistors comprising a first n-type transistor and a second n-type transistor; a second pair of transistors comprising a first p-type transistor and a second p-type transistor, wherein each of the first n-type transistor and the first p-type transistor has a drain electrically connected to a first output node, and each of the second n-type transistor and the second p-type transistor has a drain electrically connected to a second output node; and a transformer that is electrically coupled between the first output node and the second output node.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. An apparatus, comprising:
   a first transistor pair electrically coupled to a pair of output nodes, which includes a first output node and a second output node;
   a second transistor pair electrically coupled to the pair of output nodes, wherein each of the first and second transistor pairs includes a transistor having a drain electrically connected to the first output node; and
   an inductive unit electrically coupled between the output nodes and electrically coupled between gates of the first transistor pair, wherein the inductive unit comprises:
      a first inductive element electrically coupled to one gate of the first transistor pair; and
      a second inductive element electrically coupled to the first output node, wherein the first inductive element and the second inductive element are configured to be magnetically coupled to each other.

2. The apparatus of claim 1, wherein:
   the first inductive element and the second inductive element are configured to generate a variable inductance; and
   the first inductive element has an inductance value larger than or equal to that of the second inductive element.

3. The apparatus of claim 1, wherein the first inductive element and the second inductive element are formed on a same metal layer and have a horizontal coupling to each other.

4. The apparatus of claim 1, wherein each of the first inductive element and the second inductive element is an inductor having at least one turn and an even number of ports.

5. The apparatus of claim 4, wherein the first inductive element has at least one of:
   a first turn located inside the at least one turn of the second inductive element; and
   a second turn located outside the at least one turn of the second inductive element.

6. The apparatus of claim 4, wherein the first inductive element has at least one of:
   a first port located inside the at least one turn of the second inductive element; and
   a second port located outside the at least one turn of second first inductive element.

7. The apparatus of claim 1, wherein each of the first inductive element and the second inductive element is a differentially excited inductor having a symmetric layout.

8. The apparatus of claim 7, wherein each of the first inductive element and the second inductive element is formed based on two single-ended spiral inductors.

9. The apparatus of claim 1, wherein the inductive unit further comprises:
   a third inductive element electrically coupled between the first inductive element and the other gate of the first transistor pair; and
   a fourth inductive element electrically coupled between the second inductive element and the second output node, wherein the third inductive element and the fourth inductive element are configured to be magnetically coupled to each other.

10. The apparatus of claim 1, further comprising at least one of:
    a first capacitance unit that is electrically coupled between the gates of the first transistor pair and is electrically connected in parallel with the inductive unit; and
    a second capacitance unit that is electrically coupled between the output nodes and is electrically connected in parallel with the inductive unit.

11. The apparatus of claim 10, wherein each of the first capacitance unit and the second capacitance unit comprises at least one of:

a switched capacitor whose resistance is dependent on a switching frequency of the switched capacitor; and a varactor whose capacitance is dependent on a bias voltage applied across the varactor.

12. An oscillator, comprising:

a plurality of primary inductors;

a plurality of secondary inductors each of which is magnetically coupled to a corresponding one of the plurality of primary inductors;

a first pair of transistors comprising a first transistor and a second transistor; and a second pair of transistors comprising a third transistor and a fourth transistor, wherein each of the first, second, third and fourth transistors has a drain electrically connected to the plurality of primary inductors and has a gate electrically connected to the plurality of secondary inductors.

13. The oscillator of claim 12, wherein:

the first transistor and the second transistor are n-type transistors; and the third transistor and the fourth transistor are p-type transistors.

14. The oscillator of claim 12, wherein:

each of the plurality of secondary inductors has a larger inductance than the corresponding one of the plurality of primary inductors.

15. The oscillator of claim 12, wherein:

the first transistor has a gate electrically connected to a drain of the second transistor;

the second transistor has a gate electrically connected to a drain of the first transistor;

the third transistor has a gate electrically connected to a drain of the fourth transistor; and the fourth transistor has a gate electrically connected to a drain of the third transistor.

16. The oscillator of claim 12, wherein:

the first transistor has a drain electrically connected to a drain of the third transistor;

the second transistor has a drain electrically connected to a drain of the fourth transistor;

the first transistor has a gate electrically connected to a gate of the third transistor; and the second transistor has a gate electrically connected to a gate of the fourth transistor.

17. The oscillator of claim 12, wherein:

the plurality of primary inductors has a first center tap;

the plurality of secondary inductors has a second center tap; and the first center tap and the second center tap are electrically connected to each other with a short connection.

18. The oscillator of claim 12, wherein a center tap of the plurality of secondary inductors is electrically connected to a variable resistor and a capacitor serving as a low pass filter.

19. A method for operating a circuit, comprising:

amplifying a first input voltage of a first gate of a first transistor of the circuit to a first output voltage;

magnetically coupling the first output voltage by a transformer of the circuit to a second input voltage of a second gate of a second transistor of the circuit, wherein sources of the first transistor and the second transistor are electrically connected to a same reference voltage;

amplifying the second input voltage of the second gate of the second transistor to a second output voltage;

magnetically coupling the second output voltage by the transformer to the first input voltage of the first gate;

repeating the above operations until the first input voltage is stabilized; and generating an output signal of the circuit as a clock signal based on the first and second output voltages.

20. The method of claim 19, further comprising:

applying a bias voltage to a center tap of a primary coil of the transformer, wherein the first input voltage is stabilized when an absolute change of the first input voltage after an operation repetition is smaller than a predetermined threshold.

* * * * *